(12) United States Patent
Zoellin et al.

(10) Patent No.: US 8,816,454 B2
(45) Date of Patent: Aug. 26, 2014

(54) COMPONENT HAVING A MICROMECHANICAL MICROPHONE PATTERN

(71) Applicants: Jochen Zoellin, Muellheim (DE); Ricardo Ehrenpfordt, Korntal-Muenchingen (DE); Juergen Graf, Stuttgart (DE); Christoph Schelling, Stuttgart (DE); Frederik Ante, Stuttgart (DE); Michael Curcic, Stuttgart (DE)

(72) Inventors: Jochen Zoellin, Muellheim (DE); Ricardo Ehrenpfordt, Korntal-Muenchingen (DE); Juergen Graf, Stuttgart (DE); Christoph Schelling, Stuttgart (DE); Frederik Ante, Stuttgart (DE); Michael Curcic, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/938,582

(22) Filed: Jul. 10, 2013

(65) Prior Publication Data

US 2014/0015070 A1 Jan. 16, 2014

(30) Foreign Application Priority Data

Jul. 11, 2012 (DE) .......................... 10 2012 212 112

(51) Int. Cl.
*H01L 29/84* (2006.01)
(52) U.S. Cl.
USPC .............................. 257/416; 257/415; 438/50
(58) Field of Classification Search
USPC ..................................... 257/415–416; 438/50
See application file for complete search history.

(56) References Cited

U.S. PATENT DOCUMENTS

| 6,535,460 | B2 | | 3/2003 | Loeppert et al. |
| 7,218,742 | B2 | * | 5/2007 | Kay et al. ....................... 381/175 |
| RE40,781 | E | * | 6/2009 | Johannsen et al. ............. 381/174 |
| 2007/0222006 | A1 | * | 9/2007 | Weber et al. .................. 257/414 |

* cited by examiner

*Primary Examiner* — Jami M Valentine
(74) *Attorney, Agent, or Firm* — Kenyon & Kenyon LLP

(57) ABSTRACT

A microphone component has a micromechanical microphone pattern which is implemented in a layer construction on a semiconductor substrate and includes (i) an acoustically active diaphragm which at least partially spans a sound opening on the backside of the substrate, (ii) at least one movable electrode of a microphone capacitor system, and (iii) a stationary acoustically penetrable counterelement having through holes, which counterelement is situated in the layer construction over the diaphragm and functions as the carrier for at least one immovable electrode of the microphone capacitor system. The diaphragm is tied in to the semiconductor substrate in a middle area, and the diaphragm has a corrugated sheet metal type of corrugation, at least in regions.

9 Claims, 2 Drawing Sheets

COMPONENT HAVING A MICROMECHANICAL MICROPHONE PATTERN

BACKGROUND OF THE INVENTION

1. Field of the Invention

The present invention relates to a component having at micromechanical microphone pattern, which is implemented in a layer construction on a semiconductor substrate. The microphone pattern includes an acoustically active diaphragm which spans at least partially a sound opening nozzle on the backside of the substrate. The diaphragm is equipped with at least one movable electrode of a microphone capacitor system. Furthermore, the microphone pattern includes a stationary acoustically penetrable counterelement having through holes, which is situated in the layer construction over the diaphragm, and functions as a carrier for at least one immovable electrode of the microphone capacitor system. The diaphragm's being acted upon by sound takes place via the sound opening in the substrate and/or via the through holes in the counterelement. The diaphragm deflections resulting from this are recorded as capacitive fluctuations with the aid of the microphone capacitor system.

2. Description of the Related Art

A microphone component of the type mentioned at the outset is described in U.S. Pat. No. 6,535,460 B2. The design of this microphone component includes a substrate, having a sound opening, which is spanned by a diaphragm. A perforated counterelement is situated above the diaphragm, at a distance from it, and is connected to the substrate in the edge region of the sound opening. The diaphragm and the counterelement jointly form a microphone capacitor, the diaphragm acting as a movable electrode, while the stationary counterelement is equipped with a rigid counterelectrode.

The circular diaphragm of the known microphone component is tied in to the layer construction of the component via spring elements. In the case of sound pressure, these spring elements are first of all deformed, so that the diaphragm is deflected essentially plane-parallel. In this context, the air leakage current path changes in the area of the spring elements. This flow path increases with increasing diaphragm deflection, which leads to a deterioration of the measuring signal, particularly at high sound levels.

In the case of the known microphone component, the diaphragm and the spring elements are patterned from a thin conductive polycrystalline layer. Such diaphragm patternings, based on their slight thickness and superficial roughness of polycrystalline layers are particularly sensitive to loads that suddenly occur, especially with respect to accelerations such as may occur, for instance, in the case of impacts or falling down.

BRIEF SUMMARY OF THE INVENTION

The present invention provides measures for improving microphone sensitivity and the linearity of the microphone signal of a microphone component of the type mentioned at the outset, which also contribute to an increase in the robustness of the component.

According to the present invention, the diaphragm is tied in to the semiconductor substrate in a central area. In addition, the diaphragm is equipped, at least in areas, with a corrugated metal-shaped corrugation, so as to make possible a significant diaphragm deformation conditioned upon sound pressure.

By contrast to the known microphone component, the diaphragm suspension of the microphone component according to the present invention is accordingly rigid. In addition, the diaphragm suspension is displaced from the edge region to the central area. Accordingly, the diaphragm deflection conditioned upon sound pressure in the microphone component according to the present invention is not based on a deformation of the diaphragm suspension but on a deformation and arching of the diaphragm itself. Because of the layout of the corrugated steel-shaped corrugation, the deformable diaphragm area is defined, for one thing. For another thing, the configuration of the corrugation determines the extent of the deformation-conditioned diaphragm deflection at a given sound level.

Based on the rigid diaphragm suspension in the center area of the diaphragm, the size of the air leakage current path between the two sides of the microphone diaphragm is extensively independent of the sound level, which contributes to the linearity of the microphone signal. Accordingly, in this case, the microphone sensitivity is also essentially independent of the sound level. Nevertheless, relatively large diaphragm deflections may be achieved, and with that, also relatively large measuring signals, by a suitable layout of the diaphragm and the corrugation in the diaphragm.

In addition, the microphone structure of the component, according to the present invention, is relatively robust with respect to accelerations because of the rigid diaphragm suspension in the center area of the diaphragm.

There are basically many possibilities for implementing a microphone component, according to the present invention, particularly as regards the layout of the diaphragm and the diaphragm suspension.

Thus, the diaphragm may be designed to be circular or even cornered. It may be connected to the semiconductor substrate, in the manner of a paddle, only on one side via a rigid suspension crosspiece, which extends from the edge region of the sound opening all the way into the diaphragm area. However, the diaphragm may also be tied to the semiconductor substrate via a plurality of suspension crosspieces, the suspension crosspieces being situated distributed symmetrically or even asymmetrically over the diaphragm edge.

In one particularly advantageous variant of the present invention, the diaphragm suspension includes at least two suspension crosspieces, which each extend from an edge section of the sound opening to an opposite edge section of the sound opening, and cross in the center area of the diaphragm. In this case, the crossing area of the suspension crosspieces forms the centrical suspension for the diaphragm, which may be situated centrically or even eccentrically. In this instance, the suspension crosspieces subdivide the diaphragm into segments, in which, in a meaningful way, in each case a radially outward running corrugated sheet metal-shaped corrugation is developed. This form of the corrugation supports the deformability of the individual diaphragm segments particularly well.

The diaphragm edge is otherwise advantageously not tied into the layer construction of the microphone structure, so that as large as possible areas of the diaphragm are able to arch, conditioned upon the sound pressure, and be deflected therewith.

In order to increase the robustness, the microphone structure of the component, according to the present invention, is advantageously conceived to have an overload protection for the diaphragm on both sides. On the side of the diaphragm opposite the sound opening, the counterelement may simply be used as the overload protection. For this purpose, the counterelement is advantageously equipped to have an electrical insulating layer, in order to avoid a short circuit of the microphone capacitor system in overload situations. An overload protection on the substrate side is implemented particularly simply if the diaphragm edge is not tied in to the layer construction of the microphone structure. In this case, the edge region of the sound opening may simply be used as a substrate-side stop for the diaphragm, if the diaphragm is designed so that it extends, at least in areas, to beyond the edge region of the sound opening.

What is essential for the microphone sensitivity of the component, according to the present invention, is the speed of the pressure equalization over the air leakage current paths between the two sides of the microphone diaphragm. In order to achieve a uniform microphone sensitivity that is independent of the sound level, the size of the air leakage current paths should not vary with the sound pressure, if possible. In one preferred specific embodiment of the component according to the present invention, for this purpose, at least one fin-like structural element is developed on the side of the diaphragm facing the counterelement, which projects into a correspondingly shaped through opening of the counterelement. In this variant, the diaphragm is thus toothed via the at least one fin-like structural element to such an extent with the counterelement that the size of the air leakage current path changes only negligibly with normal diaphragm deflections. The fin-like structural elements have to have flows around them for the pressure equalization, and thus they prevent a direct pressure equalization between the front side and the backside of the diaphragm. This acoustical sealing contributes to a diminution of the inherent noise. The length of flow path is able to be varied via size, shape, situation and number of the fin-like structural elements. In general, there are different possibilities for producing the semiconductor element of the invention, in particular with regard to the structure of the conductive layer. In this way, the flow resistance is able to be specifically influenced in a relatively large area, in order to implement a certain microphone characteristic.

Such a fin-like structural element may simply be implemented in the form of a continuation, which essentially projects perpendicularly away from the diaphragm surface, and essentially has a two-dimensional extension. This means that the width of the continuation is quite low compared to its length, i.e. to the course in the diaphragm plane and with respect to its height, i.e. the extension perpendicular to the diaphragm plane. The cross sectional form of the continuation is determined essentially by the manufacturing method and the patterning process. Such a fin-like structure element may be of the same shape over its entire height, for example. With regard to a good toothing at as unhindered as possible a diaphragm motion, it has proven itself as advantageous, at least as of a certain structural height, if the fin-shaped structural element tapers with increasing distance from the diaphragm plane.

An essentially constant air leakage rate between the two sides of the microphone diaphragm may also be achieved with the aid of pressure compensating openings in the middle area of the diaphragm. Such pressure compensating openings may simply be specified in the layout of the diaphragm, and produced together with the diaphragm in the standard etching method.

In particular, with a view to the robustness of the microphone pattern it has proven to be advantageous if the semiconductor substrate of the component according to the present invention is a monocrystalline semiconductor material, particularly a silicon wafer. For, in this case, at least one layer of the diaphragm may be patterned out of the monocrystalline semiconductor substrate. A monocrystalline diaphragm thus produced is particularly resistant to breaking. In addition, it has no internal stress or even a stress gradient over its thickness, which is reflected especially advantageously in its high flexibility and a planar diaphragm that is not arched in the radial direction.

The at least one suspension crosspiece is advantageously patterned out of the semiconductor substrate in a backside etching process, so that it extends essentially over the entire thickness of this semiconductor substrate. In this way it may simply be ensured that the diaphragm suspension is actually indeed rigid.

DETAILED DESCRIPTION OF THE INVENTION

Figure 1A:
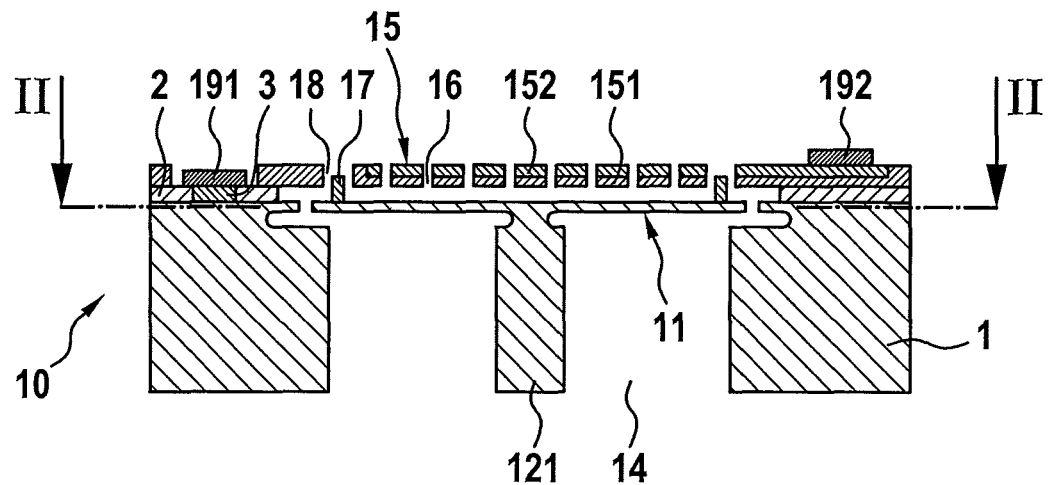
FIG. 1a shows a schematic sectional view through the microphone pattern of a component 10 according to the present invention, in a rest state.
Figure 1B:
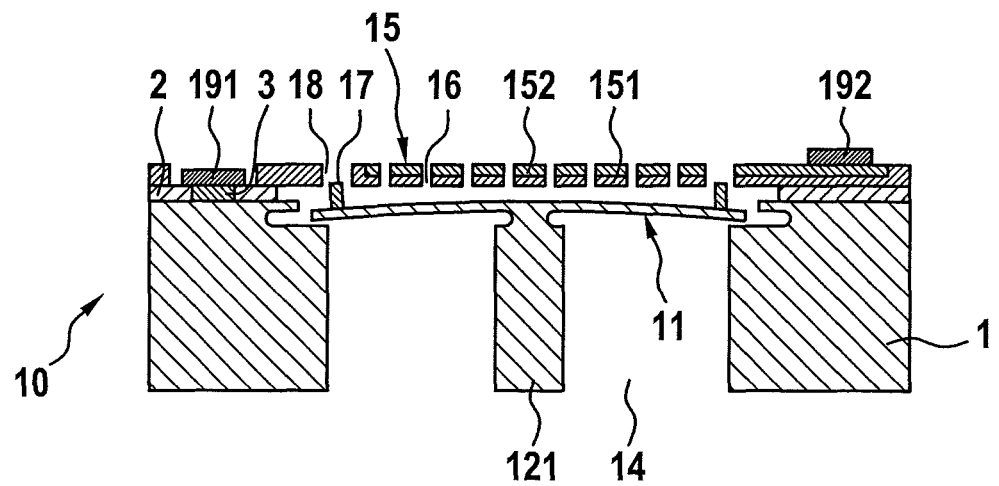
FIG. 1b shows a schematic sectional view through the microphone pattern of component 10 having a deflected diaphragm.
Figure 1C:
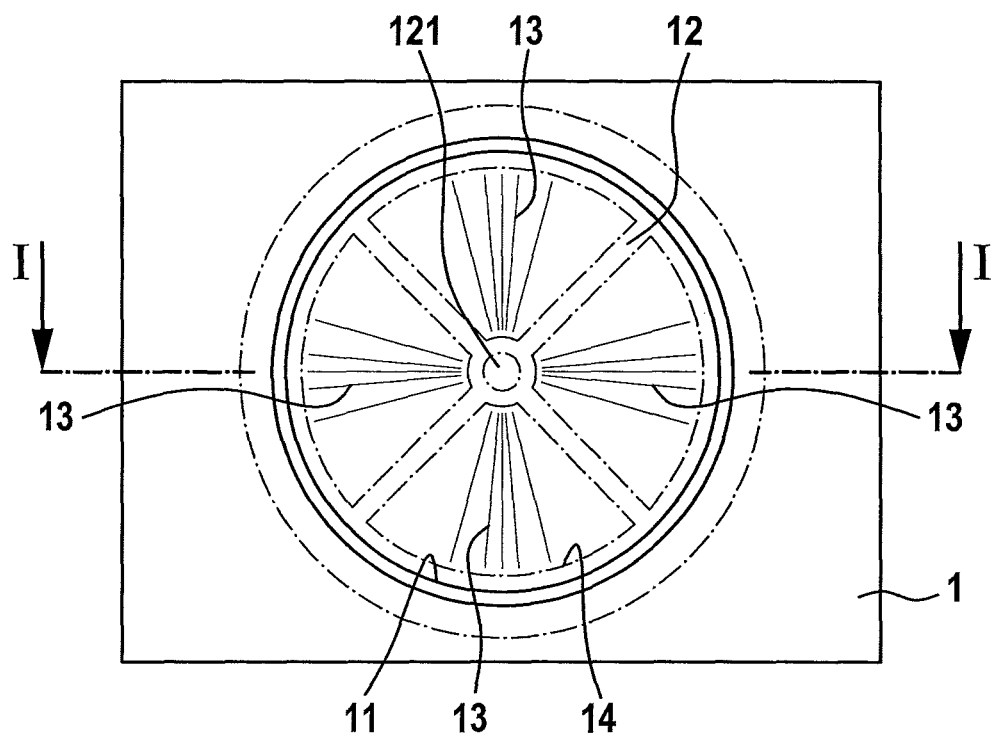
FIG. 1c shows a schematic sectional view through the diaphragm plane of component 10.

MEMS component 10 shown in FIGS. 1a to 1c is a microphone component. The microphone pattern is implemented in a layer construction on a semiconductor substrate 1, which is illustrated particularly in FIGS. 1a and 1b. It includes an acoustically active diaphragm 11, which spans a sound opening 14 on the backside of the substrate, and a stationary acoustically penetrable counterelement 15 having through hole openings 16, which is situated in the layer construction above diaphragm 11. Through holes 16 are used in first place to ventilate the microphone pattern, and thus contribute to the damping reduction of microphone diaphragm 11. FIG. 1c illustrates that diaphragm 11 in the present exemplary embodiment is circular and is situated concentrically to cylinder-shaped sound opening 14. The diameter of diaphragm 11 is greater than the cross sectional area of sound opening 14.

The diaphragm deflections conditioned upon the sound pressure are recorded capacitively, diaphragm 11 functioning as a movable electrode and stationary counterelement 15 functioning as an immovable electrode of a microphone capacitor system.

According to the present invention, diaphragm 11 is tied in to semiconductor substrate 1 in a middle area 121. For this, the diaphragm suspension, in the exemplary embodiment described here, includes two rigid suspension crosspieces 12 which each extend from one side of sound opening 14 to the opposite side, and cross at the center of diaphragm 11. In this way, diaphragm 11 is tied to semiconductor substrate 1 at crossing area 121 of the two suspension crosspieces 12, and is thus suspended centrically.

Furthermore, according to the present invention, diaphragm 11 has a sheet metal-shaped corrugation 13, which in the exemplary embodiment shown here is developed in each of the four quadrants of diaphragm 11 separated by suspension crosspieces 12, and runs radially.

Since diaphragm 11 is centrally rigidly suspended, the sound pressure has the effect of arching of the four diaphragm quadrants. This arching, and the significant deflection of the diaphragm connected with it is first made possible by corrugations 13. For, corrugations 13 not only provide the flexibility required for the diaphragm arching, but also make possible the extension of the diaphragm surface connected with it, in that diaphragm 11 in corrugation areas 13 forms outward protuberances and is smoothed out. Accordingly, the layout of corrugations areas 13 also determines the size of the deflectable diaphragm surface.

In the present exemplary embodiment, acoustically active diaphragm 11 is exclusively tied in to semiconductor substrate 1 via suspension crosspieces 12 and crossing area 121. The diaphragm edge is otherwise not tied in to the layer construction of the microphone pattern, so that diaphragm 11 is able to have a flow around it in order to make possible a pressure compensation between the two sides of diaphragm 11.

In this case, diaphragm 11 was patterned out in a front side etching process from the monocrystalline silicon of semiconductor substrate 1, and exposed. Semiconductor substrate 1 is preferably low-resistance, so that it may be used simultaneously as an electrical screen and an electrical supply line for diaphragm 11, that is, as an electrical supply line for the movable electrode of the microphone capacitor system.

Sound opening 14 was produced in the backside of the substrate, essentially independently of this. In the process, the rigid diaphragm suspension was also patterned out of semiconductor substrate 1. Accordingly, suspension crosspieces 12 are developed with crossing area 121 in the same thickness of semiconductor substrate 1, which is illustrated by FIGS. 1a, 1b. Diaphragm 11 extends beyond the edge region of sound opening 14, so that the edge region of sound opening 14 forms a stop on the substrate side for diaphragm 11, and in this way functions as an overload protection.

Along the outer edge region of diaphragm 11, fin-like patterned elements 17 are developed which protrude from the diaphragm plane and extend into corresponding slot-type recesses 18 of counterelement 15. This toothing is conceived in such a way that diaphragm arching or diaphragm deflections, conditioned upon sound pressure, are not hindered. In addition, the patterning height was selected so that patterned element 17 will protrude all the way into recesses 18 of counterelement 15, even in the case of diaphragm arching, which is illustrated by FIG. 1b. Thereby the flow path between the two sides of diaphragm 11 is narrowed on the one hand, and on the other hand it is purposefully lengthened, since fin-like patterned elements 17 have to be flowed around during pressure compensation as dam-like obstacles. In addition, the flow path between the two sides of diaphragm 11 changes only insubstantially if diaphragm 11 is deflected. The flow resistance during pressure compensation between the two sides of diaphragm 11 may thus be influenced purposefully by variations in the design parameters of fin-like patterned element 17 and corresponding recesses 18 in counterelement 15. In the case of microphone component 10 described here, the flow path is constricted even further by diaphragm arching, which may be seen in FIG. 1b. This helps to improve the microphone signal.

Counterelement 15 is connected to semiconductor substrate 1 via an insulating layer 2 in the frame area of diaphragm 11. The lowest layer 151 of counterelement 15 facing diaphragm 11 is made up in this case of an electrically insulating layer material, such as silicon oxide. Over this, there is an electrically conductive layer 152, such as an epi-polysilicon layer, in which the counterelectrode of the microphone capacitor system is developed. Stationary counterelement 15 borders the diaphragm deflection on the upper side, electrically insulating layer 151 preventing a short circuit between the electrodes of the microphone capacitor in case they touch each other. Through holes 16 over the center range of diaphragm 11 preferably have a compact round or rectangular cross sectional area, while recesses 18, which are here also implemented in the form of through holes in counterelement 15, with respect to fin-like patterned elements 17 on diaphragm 11 are rather slot-shaped.

The electrical contacts for the two electrodes of the microphone capacitor system are located in the form of bonding pads 191 and 192 on the component surface in the frame region of diaphragm 11. The one bonding pad 191 on the left side of representations FIGS. 1a, 1b is connected via an opening in insulating layer 2 and a polysilicon area 3 to semiconductor substrate 1, so that diaphragm 11 and the deflectable electrode of the microphone capacitor system is electrically contacted via at least one suspension crosspiece 12. The other bonding pad 192 on the right side of representations FIGS. 1a, 1b is in direct contact to electrically conductive layer 152 of counterelement 15, and with that, to the stationary electrode of the microphone capacitor system.

What is claimed is:

1. A component, comprising:
   a micromechanical microphone pattern implemented in a layer construction on a semiconductor substrate, the micromechanical microphone pattern including:
   an acoustically active diaphragm which (i) at least partially spans a sound opening in a backside of the substrate, and (ii) has at least one movable electrode of a microphone capacitor system; and
   a stationary acoustically penetrable counterelement having through holes, wherein the counterelement is situated in the layer construction over the diaphragm and functions as a carrier for at least one immovable electrode of the microphone capacitor system;
   wherein the diaphragm is tied to the semiconductor substrate in a center area, and wherein at least selected regions of the diaphragm have a corrugated sheet metal shaped corrugation.

2. The component as recited in claim 1, wherein the diaphragm is tied to the semiconductor substrate via at least one rigid suspension crosspiece which extends from an edge region of the sound opening into the diaphragm area.

3. The component as recited in claim 2, wherein the diaphragm suspension includes at least two suspension crosspieces which (i) each extend from a first edge section of the sound opening to a second, opposite edge section of the sound opening and (ii) cross in the center area of the diaphragm.

4. The component as recited in claim 2, wherein, other than the tied connection via the at least one rigid suspension crosspiece, the diaphragm edge is not tied to the layer construction of the microphone pattern.

5. The component as recited in claim 2, wherein at least selected sections of the diaphragm extend beyond the edge region of the sound opening, such that the edge region of the sound opening forms a stop for the diaphragm on the substrate side.

6. The component as recited in claim 2, wherein, in the edge region of the diaphragm, on the side of the diaphragm facing the counterelement, at least one fin-like patterned element is provided, and wherein the fin-like patterned element projects into a correspondingly formed recess of the counterelement.

7. The component as recited in claim 6, wherein at least one pressure compensating opening is developed in the center area of the diaphragm.

8. The component as recited in claim 7, wherein the semiconductor substrate is a monocrystalline semiconductor material, and wherein at least one layer of the diaphragm is monocrystalline and patterned out of the semiconductor substrate.

9. The component as recited in claim 8, wherein the at least one suspension crosspiece is patterned out of the semiconductor substrate and extends essentially over the entire thickness of the semiconductor substrate.

* * * * *